(12) United States Patent
MacIntyre

(10) Patent No.: US 6,690,088 B2
(45) Date of Patent: Feb. 10, 2004

(54) INTEGRATED CIRCUIT PACKAGE STACKING STRUCTURE

(76) Inventor: Donald M. MacIntyre, 6535 Timberview Dr., San Jose, CA (US) 95120

( * ) Notice: Subject to any disclaimer, the term of this patent is extended or adjusted under 35 U.S.C. 154(b) by 0 days.

(21) Appl. No.: 10/062,943

(22) Filed: Jan. 31, 2002

(65) Prior Publication Data

US 2003/0141581 A1 Jul. 31, 2003

(51) Int. Cl.[7] .............................. H05K 3/30; H05K 1/14; H01L 23/02; H01L 23/48; H01R 43/00
(52) U.S. Cl. ..................... 257/686; 257/685; 257/723; 257/777; 257/666; 257/696; 257/698; 257/724; 257/491; 257/692; 257/673; 257/730; 29/822; 29/841; 29/830; 29/854; 361/743; 361/735
(58) Field of Search .................. 257/666, 676, 257/691–693, 696, 698, 686, 685, 723, 724, 730, 777, 772, 779, 780, 784, 786; 29/822, 841, 836, 844; 361/743, 355

(56) References Cited

U.S. PATENT DOCUMENTS

| | | | |
|---|---|---|---|
| 5,561,591 A | 10/1996 | Burns | 361/704 |
| 5,631,193 A | 5/1997 | Burns | 29/827 |
| 5,960,539 A * | 10/1999 | Burns | 29/854 |
| 6,025,642 A * | 2/2000 | Burns | 257/686 |
| 6,028,352 A | 2/2000 | Eide | 257/686 |
| 6,049,123 A | 4/2000 | Burns | 257/686 |
| 6,445,063 B1 * | 9/2002 | King et al. | 257/686 |
| 6,462,408 B1 * | 10/2002 | Wehrly, Jr. | 257/686 |
| 6,486,546 B2 * | 11/2002 | Moden et al. | 257/686 |
| 2002/0060358 A1 * | 5/2002 | Hung et al. | 257/678 |
| 2002/0126459 A1 * | 9/2002 | Albert et al. | 361/743 |
| 2003/0027437 A1 * | 2/2003 | Worz | 439/69 |

* cited by examiner

Primary Examiner—Alexander O. Williams
(74) Attorney, Agent, or Firm—Henry M. Stanley

(57) ABSTRACT

A stack of integrated circuits in thin small outline packages (TSOP's) is constructed with an air space in between adjacent packages. The TSOP's have a plurality of connection terminals extending therefrom. A lead frame is disposed adjacent to the packages, positioned medially of the air space and having a plurality of connection terminals in registration with and in electric contact with the plurality of TSOP connection terminals. The TSOP's have a chip select terminal and several unused terminals. The lead frame has a strain-relieved conductor extending between the chip select terminal on a TSOP higher in the stack to the adjacent TSOP lower in the stack. Moreover, TSOP locating surfaces are included on the lead frame in the finished stack.

9 Claims, 6 Drawing Sheets

INTEGRATED CIRCUIT PACKAGE STACKING STRUCTURE

SUMMARY OF THE INVENTION

A multiple integrated circuit (IC) assembly is disclosed containing a first IC package having a plurality of connection terminals extending therefrom, and a second IC package positioned above the first IC package so that a space is formed between the first and second IC packages. The second IC package also has a plurality of connection terminals extending therefrom. A lead frame is provided that is disposed surrounding and positioned substantially vertically between the first and second IC packages and adjacent to the space therebetween. A plurality of connection terminals are provided on the lead frame, arranged in position to electrically contact predetermined ones of the first and second IC package pluralities of connection terminals. A plurality of electrically conductive connections is provided for fixing the ones of the first and second IC packages and the lead frame pluralities of connection terminals in electrical contact.

A multiple integrated circuit (IC) assembly is disclosed including a first IC package having a plurality of connection terminals extending therefrom, and a second IC package positioned above the first IC package to thereby form an IC package stack. The second IC package has a plurality of connection terminals extending therefrom also. A lead frame is disposed in position surrounding the first and second IC packages and positioned substantially medially of the first and second IC's in the IC package stack. A plurality of connection terminals are provided on the lead frame. A first fixed positioning member is provided on the lead frame for locating the first IC package so that ones of the first IC package plurality of connection terminals are positioned in registration and in contact with the plurality of connection terminals on the lead frame. A second fixed positioning member is provided on the lead frame for locating the second IC package so that ones of the second IC package plurality of connection terminals are positioned in registration and in contact with the plurality of connection terminals on the lead frame. A plurality of electrically conductive connections is provided for fixing the ones of the first and second IC packages and the lead frame pluralities of connection terminals in electrical contact.

A multiple integrated circuit (IC) assembly is provided including a first IC package having a plurality of connection terminals extending therefrom and a second IC package positioned above the first IC package to thereby form an IC package stack. The second IC package also has a plurality of connection terminals extending therefrom. A lead frame is disposed in position surrounding the first and second IC packages and positioned substantially medially of the first and second IC's in the IC package stack. A plurality of connection terminals are provided on the lead frame. An IC package select conductor is provided on the lead frame. The package select conductor is fixed in electrical contact at one end on one of the first package plurality of terminals and on the other end on one of the second package plurality of terminals. A strain relief portion is situated along the length of the package select conductor. Also included is a plurality of electrically conductive connections for fixing the ones of the first and second IC packages and the lead frame pluralities of connection terminals in electrical contact.

DESCRIPTION OF THE PREFERRED EMBODIMENTS

It has been found to be advantageous to stack thin small outline packages (TSOP's) containing integrated circuits (IC's), such as the Micron Technology, Inc. C-5, so that they take up less of the surface area on a circuit board. Moreover, two stacked 16-meg memory IC's are cheaper than one 32-meg IC. These memory chips have a plurality of connection terminals or pins extending from the side thereof. There are 54 pins, 27 on each side, in the TSOP's used as examples in explaining the present invention. Each TSOP has a chip select connector or pin as well as a number of unused pins. The chip selector pin is located in the same location on the package in any particular TSOP model or type, and the several unused pins are also located in the same position on each TSOP for a given package. As a result, when the TSOP's are stacked vertically with the upper package connection terminals in registration with the connection terminals on the lower package, the chip select pin and the unused pins are in vertical alignment.

Figure 1:
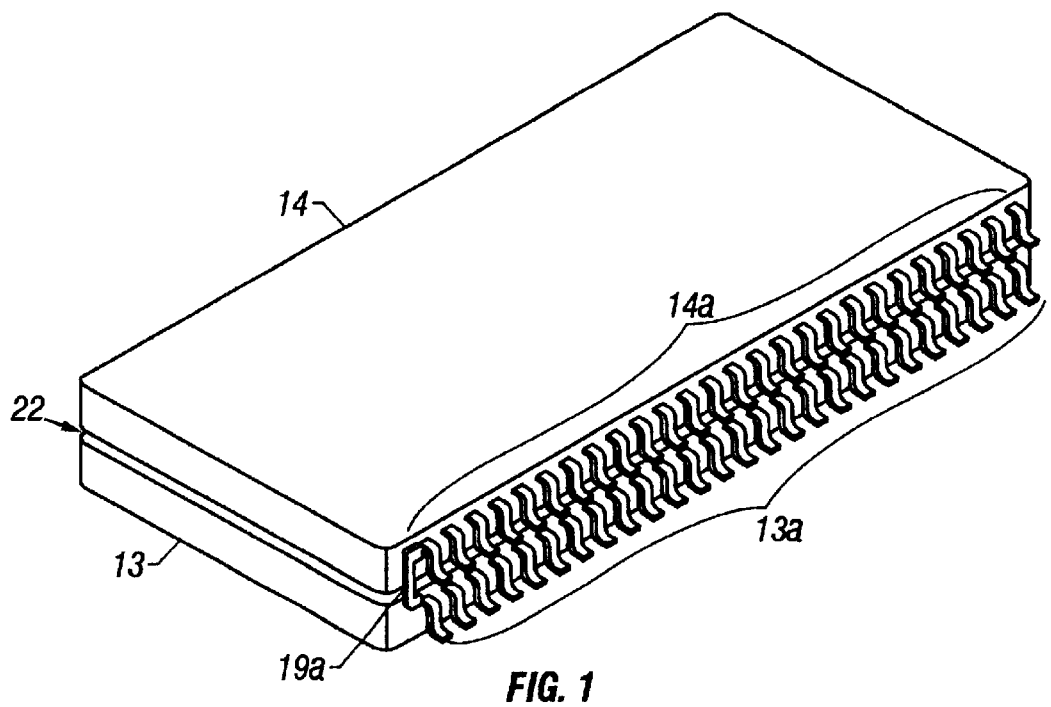
FIG. 1 shows an IC stack and lead frame assembly according to the present invention.

FIG. 1 shows one embodiment of the IC stack disclosed and claimed herein, wherein a lower TSOP 13 with a plurality of connection terminals 13a has an upper TSOP 14 with a plurality of extending connection terminals 14a mounted above it. An air space 22 is provided between the TSOP's 13 and 14. A lead frame 10b, not readily visible in FIG. 1 and to be hereinafter described, is situated medially between and extending into the space 22 between the stacked TSOP's. The lead frame is electrically connected to ones of the connection terminals 13a and 14a. A package guide or TSOP positioning member 19a is formed on the lead frame at each of the four corners thereof (one shown in FIG. 1) for purposes discussed later in this description.

Figure 2:
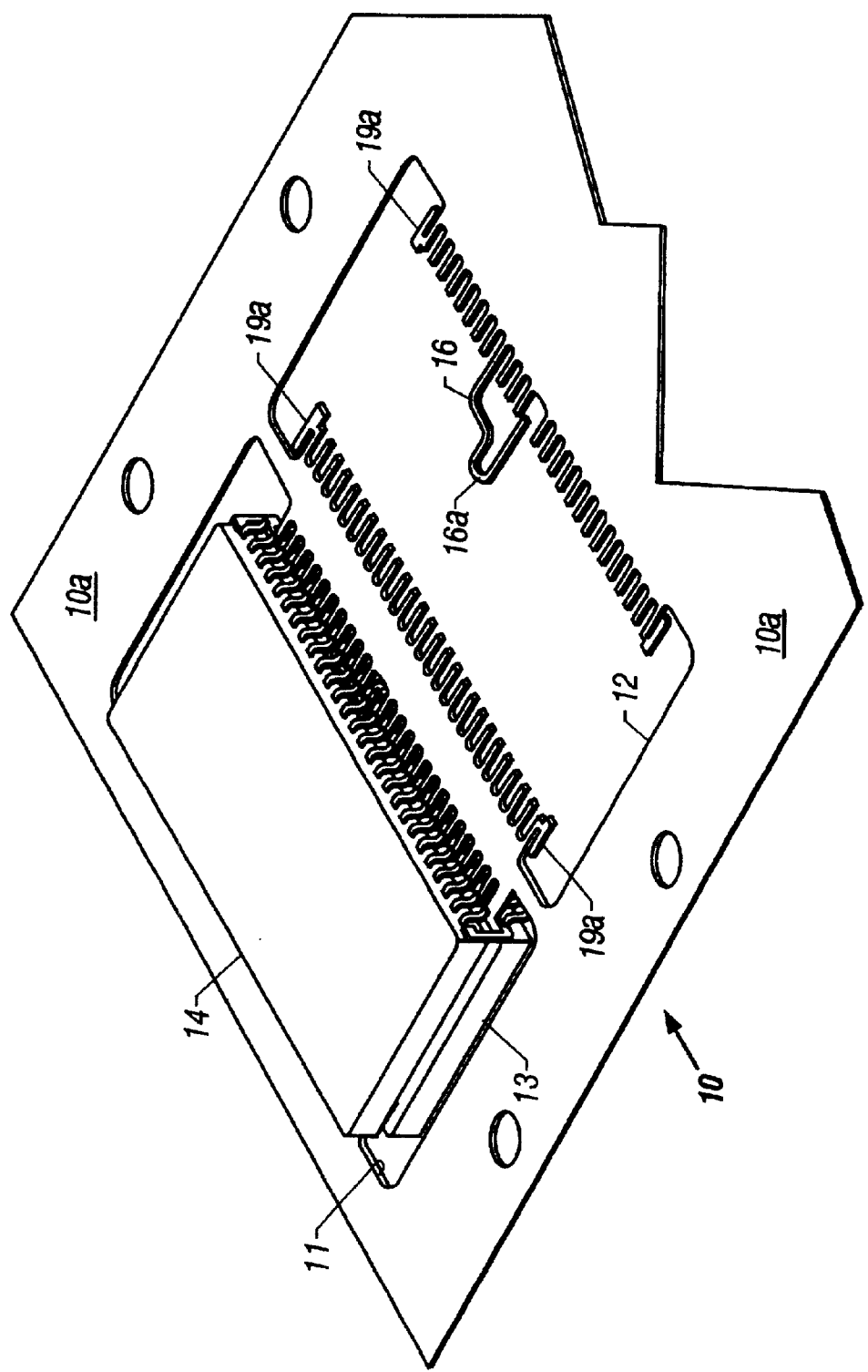
FIG. 2 is a perspective showing the present invention prior to removing the waste portions of the lead frame.

Turning to FIG. 2 of the drawings, a thin electrically conductive member 10 has a first opening 11 and a second opening 12 as shown. There are a number of such openings in the member 10 of FIG. 1. Member 10 is shown in FIG. 2 to assist in illustrating that portion of the member 10 that is formed or shaped and hereinafter referred to as the lead frame. The remainder of the member 10 is cut away and discarded as waste. The pair of TSOP's 13 and 14 is shown contained within the first opening 11 in the member 10 with TSOP 14 spaced from and positioned above TSOP 13. The manner in which the stacked TSOP's are held together will be described hereinafter.

Figure 3:
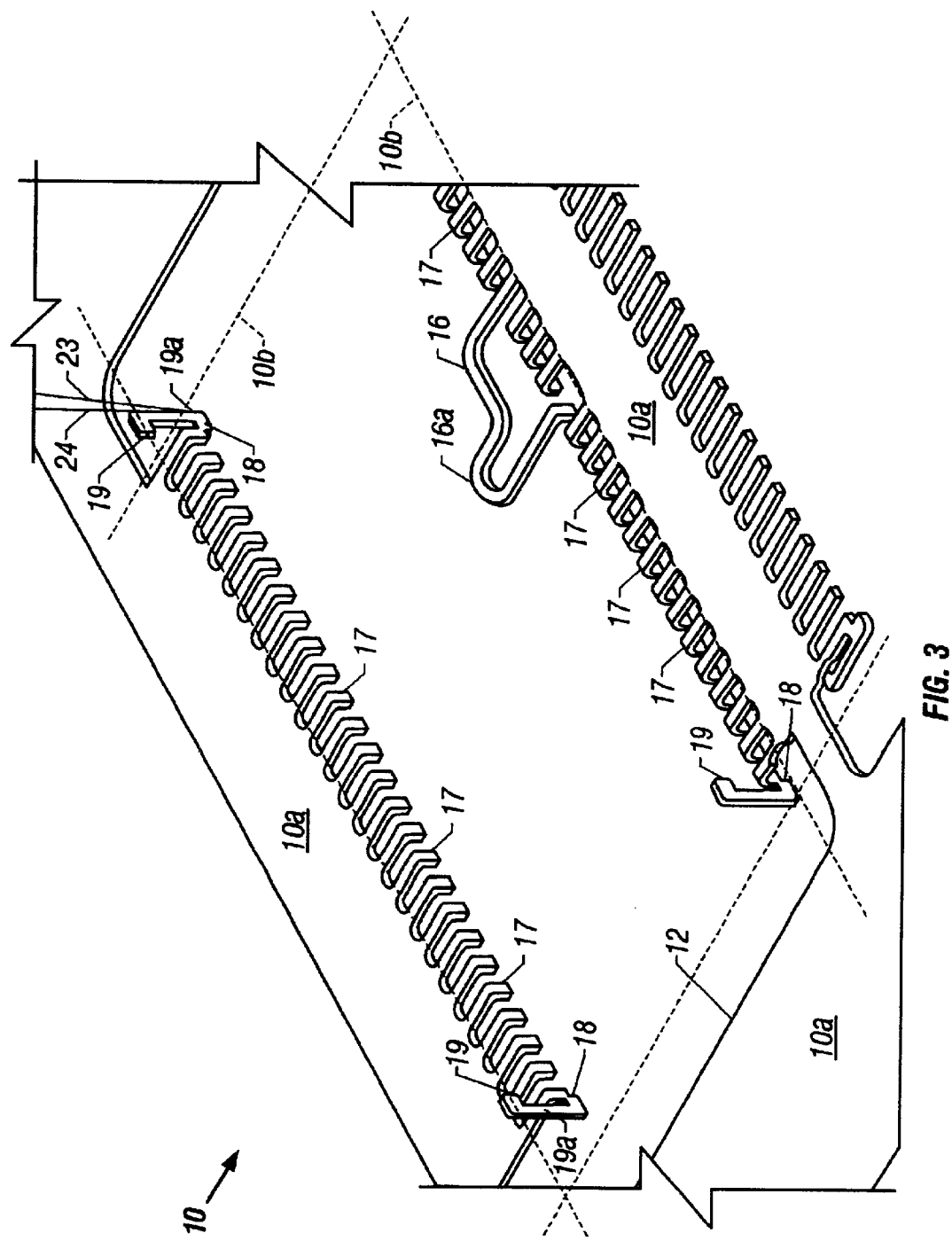
FIG. 3 is a perspective of a lead frame used in the present invention prior to cutting away the waste portions of the lead frame.

Looking now at the opening 12 in FIG. 2, the structure of the lead frame 10b of the invention described herein is shown included in the member 10 and prior to formation of the plurality of connection terminals and the TSOP positioning members on the lead frame. An IC package select conductor 16 is shown in FIG. 2 prior to final formation of the lead frame extending into the opening 12. FIG. 3 shows the lead frame components within the opening 12 as utilized in the present invention. FIG. 3 depicts the lead frame 10b after formation of the package select conductor 16 and a plurality of connection terminals 17, but prior to the installation of the TSOP's 13 and 14. FIG. 3 represents the member 10 prior to removal of the waste portions 10a. Upon removal of the waste portions, the lead frame 10b remains as that portion of the member 10 within the phantom lines shown in FIG. 3.

The entire member 10 is properly tinned to accommodate subsequent electrically conductive connections, such as solder connections. The lead frame 10b has a plurality of formed connection terminals 17 shown extending into the opening 12 in FIG. 3. The pattern of terminals 17 substantially matches the terminal or pin pattern on the TSOP's 13 and 14. The connection terminals 17 and the package select conductor 16 are all formed to extend downwardly at the free ends thereof, as shown in FIG. 3. The downwardly extending free ends of the connection terminals 17 and the IC package select conductor 16 terminate substantially in a common plane. Also shown in FIG. 3 is a lower TSOP location surface 18 positioned at each of the four corners of the lead frame as well as an upper TSOP location surface 19 also located on each of the four corners of the lead frame. The lead frame 10b of the present invention is cut away from the waste portions 10a substantially along the phantom lines in FIG. 3 to form the final package configuration containing stacked TSOP's and the intermediately positioned lead frame 10b containing items 16, 17, 18,19 and 19a as seen in FIG. 3.

Note the loop 16a in the IC package select conductor 16. Since the free end of the package select conductor 16 is attached in electrical contact with one of the pins 13a on TSOP 13, as will be hereinafter explained, both ends of the package select conductor are fixed. There are materials other than the material of the lead frame in the integrated circuit packages such as TSOP's 13 and 14 that have temperature coefficients of expansion which are quite different from the temperature coefficient of expansion of the package select conductor material. The effects of these temperature coefficient differentials over wide ranges of temperature tend to stress and cause separation of the free end of the package select conductor from the terminal 13a to which it is fixed. The loop 16a is present to relieve the stresses imposed by the temperature coefficient differentials in the conductor 16 so that the electrical connections at the ends of the conductor 16 are maintained.

Figure 4:
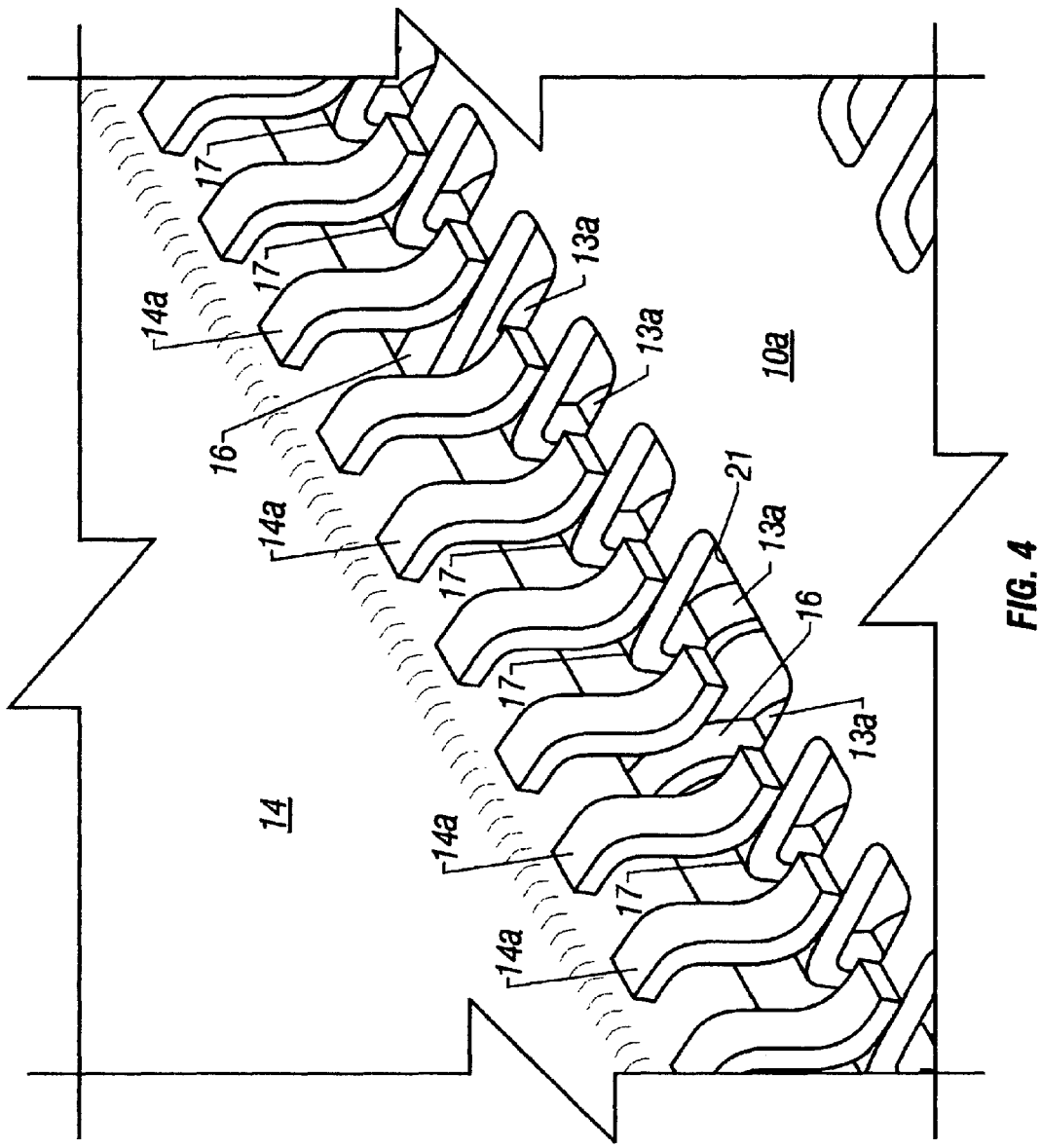
FIG. 4 is a detailed perspective showing the chip select conductor on the lead frame prior to cutting away the waste portions of the lead frame.

FIG. 4 is a detail showing TSOP 14 and the plurality of connection terminals or pins 14a extending therefrom. Some of the plurality of connection terminals 13a extending from TSOP 13 may also be seen in FIG. 4. There is a "hole" 21 in the succession of lead frame connection terminals 17 shown in FIG. 4 through which one of the lower TSOP terminals 13a is clearly seen. The upper TSOP 14 terminal 14a extending into the "hole" 21 is an unconnected unused terminal. The terminal 13a directly below terminal 14a within "hole" 21 is also an unused terminal on TSOP 13. The IC package select conductor 16 is seen in FIG. 4 having one end extending into the space between the TSOP's 13 and 14 and in electrical contact with a chip select terminal 14b for TSOP 14. The free end of the IC package select or chip select conductor 16 is shown in electrical contact with the aforementioned unused terminal 13a on TSOP 13 directly below the unused terminal 14a within the "hole" 21 in FIG. 4. In this manner, signals delivered to the terminal 13a in contact with the free end of the IC package select conductor 16 will be delivered to the chip select pin 14b of TSOP 14.

As mentioned hereinbefore, when the waste portion 10a of the member 10 is cut away, only the lead frame 10b containing the plurality of lead frame connection terminals 17, the IC package select conductor 16 and the positioning members or arms 19a are left as the lead frame 10b in the finished integrated circuit stack. Surfaces 18 and 19 are supported on the lead frame by the arms 19a at the four corners of the lead frame. Terminals 13a, 14a, 16 and 17 all being properly tinned, they are joined together where they are shown in contact by a plurality of electrically conductive connections, such as solder connections.

Figure 5:
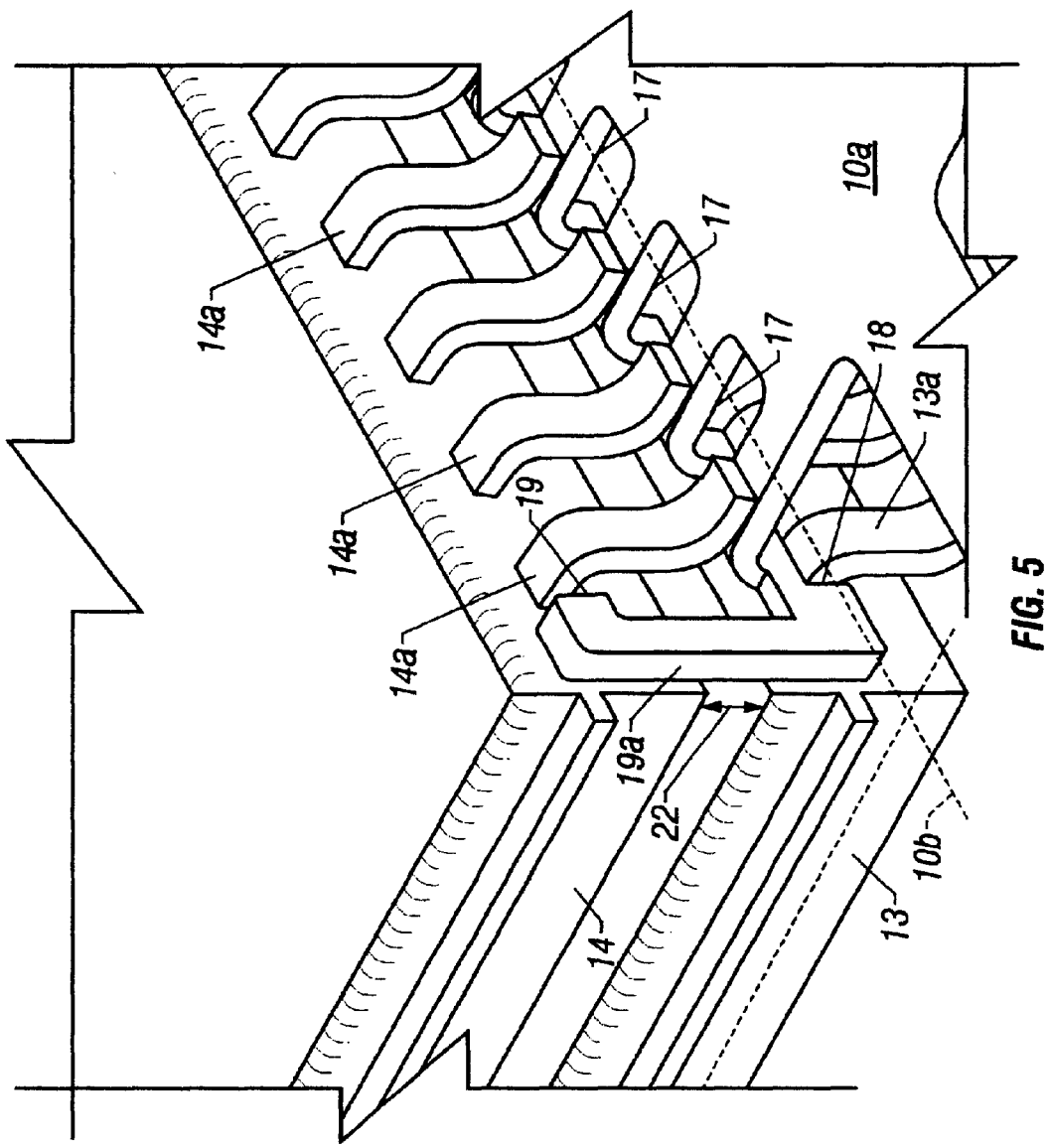
FIG. 5 is a perspective detail showing IC stack construction and IC package locators on the lead frame of the present invention.

FIG. 5 shows the space between the stacked TSOP's as an air space 22 extending between the top of TSOP 13 and the bottom of TSOP 14. The air space 22 has been found to aid dissipation of internally generated heat from the TSOP's. The air space 22 is in the range of ten to twenty thousandths of an inch in a preferred embodiment. The waste area 10a on the member 10 to be cut away from the lead frame 10b within the boundaries shown by the phantom lines in FIGS. 3 and 5 contains members 16, 16a, 17, 18, 19 and 19a. Surface 19 is configured to contact the end pin 14a on upper TSOP 14 as shown in detail in FIG. 5 and surface 18 is configured to contact the end pin 13a on lower TSOP 13 as also shown in FIG. 5. End pins 14a and 13a in FIG. 5 are other unused pins in the pin arrays of TSOP's 13 and 14. To accommodate insertion of upper TSOP's, such as upper TSOP 14 in the illustrated stack, the arm 19a supporting the surfaces 18 and 19 is bent away from the positions to be occupied by the upper TSOP through an angle from the vertical to accommodate insertion of the upper TSOP. That angle is illustrated in FIG. 3 wherein a line 23 represents the vertical (orthogonal to the plane of member 10) and a line 24 describes the departure of the arm 19a from the vertical. An appropriate angle between the vertical 23 and the orientation of the line 24 is approximately 3 degrees.

Figure 6:
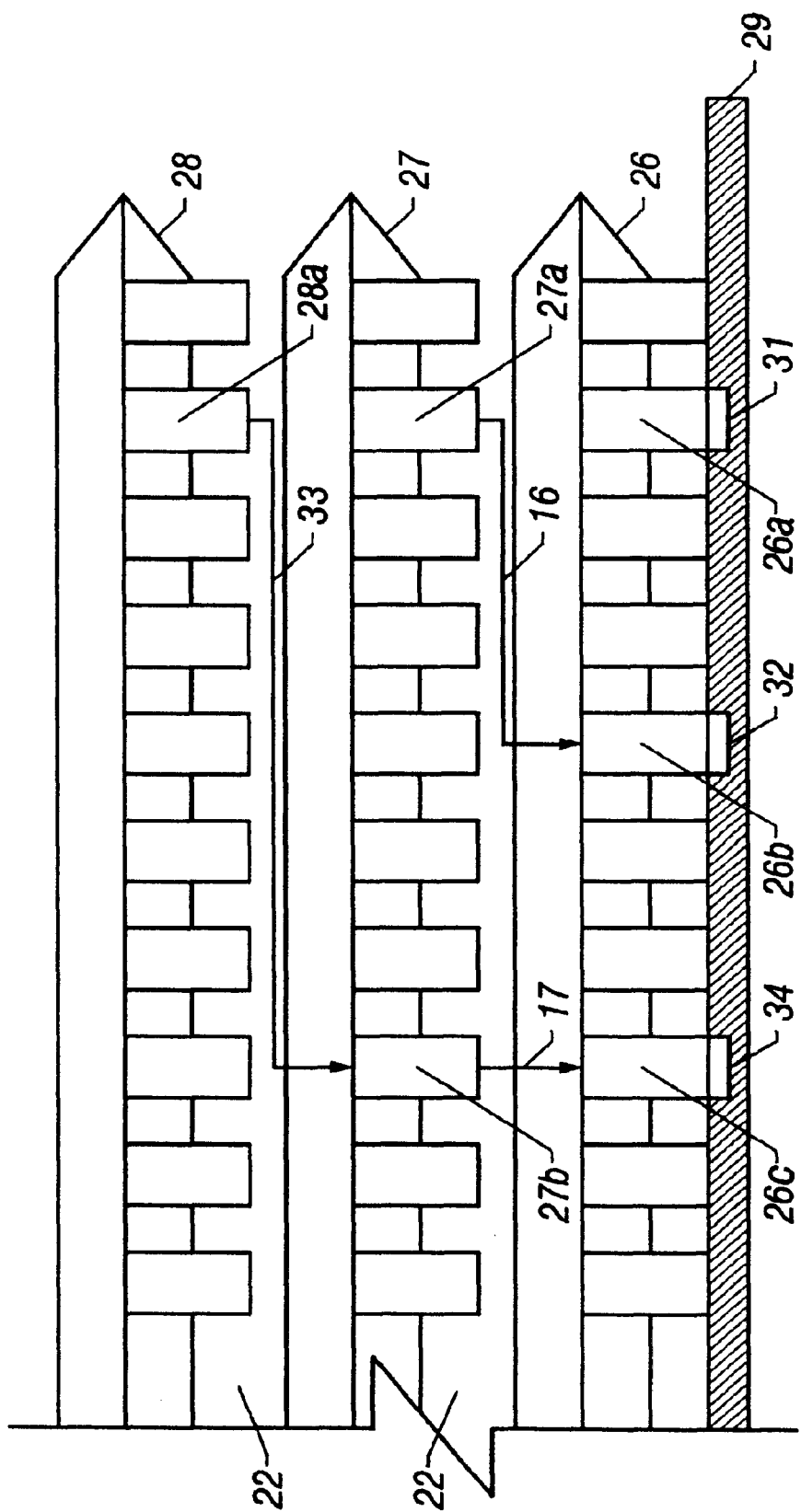
FIG. 6 is a partial elevation of a stack of IC packages joined in accordance with the present invention.

FIG. 6 shows an IC package stack of three packages 26, 27 and 28. The packages are held in position so that an air space similar to air space 22 (FIG. 5) is formed between adjacent packages as hereinbefore described. Package select terminals 26a, 27a and 28a are shown for each of the respective packages 26, 27 and 28. The bottom package 26 is mounted on a circuit board 29. Package select pin 26a is connected to a trace 31 on the circuit board that will carry the signal to select package 26. Package select terminal 27a on package 27 is shown diagrammatically connected through the package select conductor 16 to an unused pin 26c on package 26. Pin 26c is connected to a trace 32 on the PC board 29, which will carry the package select signal for package 27. Package select terminal 28a on package 28 is seen connected to an unused pin 27b on package 27 through a conductor 33 similar to package select conductor 16. Pin 27b is connected to pin 26b in package 26 through the lead frame arrangement containing terminals 17 as hereinbefore described. Unused pin 26b is connected to a trace 34 on the PC board 29, which carries the package select signal for package 28. In this fashion, the stack shown in FIG. 6 containing three stacked TSOP's is made using the structure of the lead frame 10b intermediate of the IC packages as described hereinbefore.

Although the best mode contemplated for carrying out the present invention has been shown and described herein, it will be understood that modification and variation may be made without departing from what is regarded to be the subject matter of the invention.

What is claimed:

1. A multiple integrated circuit (IC) assembly comprising a first IC package having a plurality of connection terminals extending therefrom, a second IC package positioned above said first IC package so that a space is formed between said first and second IC packages, said second IC package having a plurality of connection terminals extending therefrom, a lead frame disposed surrounding and positioned medially of said space between said first and second IC packages, a plurality of connection terminals on said lead frame arranged in position to electrically contact predetermined ones of said first and second IC package pluralities of connection terminals, and a plurality of electrically conductive connections for fixing said ones of said first and second IC packages and said lead frame pluralities of connection terminals in electrical contact, wherein said first and second IC package pluralities of terminals include a package select terminal and an unused terminal further comprising an IC package select conductor on said lead frame extending into said space between said first and second IC packages, said IC package select conductor extending between an electrical connection on said second IC package select terminal on one end and an electrical connection on said unused terminal on said first IC package on an opposing end.

2. The multiple integrated circuit assembly of claim 1 wherein said IC package select conductor comprises a conductor strain relief section for relieving stress on said IC package select conductor caused by IC package material temperature coefficient differentials.

3. The multiple integrated circuit assembly of claim 1 wherein said lead frame comprises an upper locator for locating said ones of said second IC package plurality of connection terminals in registration with said lead frame plurality of connection terminals, and a lower locator for locating said ones of said first IC package plurality of connection terminals in registration with said lead frame plurality of connection terminals.

4. A multiple integrated circuit (IC) assembly comprising a first IC package having a plurality of connection terminals extending therefrom, a second IC package positioned above said first IC package, thereby forming an IC package stack, said second IC package having a plurality of connection terminals extending therefrom, a lead frame disposed in position surrounding said first and second IC packages and positioned substantially medially of said first and second IC package stack, a plurality of connection terminals on said lead frame, a first fixed positioning surface on said lead frame for abutting a predetermined unused first IC connection terminal for locating said first IC package so that ones of said first IC package plurality of connection terminals are positioned in registration and in contact with said plurality of connection terminals on said lead frame, a second fixed positioning surface on said lead frame for abutting a predetermined unused second IC connection terminal for locating said second IC package so that ones of said second IC package plurality of connection terminals are positioned in registration and in contact with said plurality of connection terminals on said lead frame, and a plurality of electrically conductive connections for fixing said ones of said first and second IC packages and said lead frame pluralities of connection terminals in electrical contact.

5. The multiple integrated circuit assembly of claim 4 wherein a space is formed between said first and second IC packages in said IC package stack, and wherein said first and second IC package pluralities of connection terminals include a package select terminal and an unused terminal, further comprising an IC package select conductor on said lead frame extending into said space between said first and second IC packages, said IC package select conductor extending between an electrical connection on said second IC package select terminal on one end and an electrical connection on said unused terminal on said first IC package on an opposing end.

6. The multiple integrated circuit assembly of claim 5, wherein said IC package select conductor comprises a conductor strain relief section for relieving stress on said IC package select conductor electrical connections caused by IC package material temperature coefficient differentials.

7. A multiple integrated circuit (IC) assembly comprising a first IC package having a plurality of connection terminals extending therefrom, a second IC package positioned above said first IC package, thereby forming an IC package stack, said second IC package having a plurality of connection terminals extending therefrom, a lead frame disposed in position surrounding said first and second IC packages and positioned substantially medially of said first and second IC package stack, a plurality of connection terminals on said lead frame, an IC package select conductor on said lead frame extending between laterally spaced ones of said connection terminals on said first and second IC packages, a strain relief portion along said IC package select conductor for relieving stress therein caused by IC package material temperature coefficient differentials, and a plurality of electrically conductive connections for fixing said ones of said first and second IC packages and said lead frame pluralities of connection terminals in electrical contact.

8. The multiple integrated circuit assembly of claim 7 wherein a space is formed between said first and second IC packages, and wherein said first and second IC package pluralities of connection terminals comprise a package select terminal, and an unused terminal, wherein said IC package select conductor extends within said space between said package select terminal on said second IC package on one end and said unused terminal on said first IC package on the other end.

9. The multiple integrated circuit assembly of claim 7, further comprising a first fixed positioning surface on said lead frame for abutting a predetermined unused first IC connection terminal for locating said first IC package so that ones of said first IC package plurality of connection terminals are positioned in registration and in contact with said plurality of connection terminals on said lead frame, and a second fixed positioning surface on said lead frame for abutting a predetermined unused second IC connection terminal for locating said second IC package so that ones of said second IC package plurality of connection terminals are positioned in registration and in contact with said plurality of connection terminals on said lead frame.

* * * * *